United States Patent [19]

Bortscheller et al.

[11] Patent Number: 4,597,001
[45] Date of Patent: Jun. 24, 1986

[54] THIN FILM FIELD-EFFECT TRANSISTORS WITH TOLERANCE TO ELECTRODE MISALIGNMENT

[75] Inventors: Jacob C. Bortscheller, Ballston Spa; Jack D. Kingsley, Schenectady; William W. Piper, Scotia, all of N.Y.

[73] Assignee: General Electric Company, Schenectady, N.Y.

[21] Appl. No.: 657,857

[22] Filed: Oct. 5, 1984

[51] Int. Cl.[4] .............................................. H01L 29/78
[52] U.S. Cl. .......................................... 357/23.7; 357/2
[58] Field of Search ................................... 357/2, 23.7

[56] References Cited

U.S. PATENT DOCUMENTS 3,385,731  5/1968  Weimer ......................... 357/23.7 X

OTHER PUBLICATIONS

Hayama et al., *Appl. Phys. Lett.*, 36(9) May 1, 1980 pp. 754-755.

*Primary Examiner*—Martin H. Edlow
*Attorney, Agent, or Firm*—John R. Rafter; James C. Davis, Jr.; Marvin Snyder

[57] ABSTRACT

In a thin film field-effect transistor, source and drain electrodes each include at least one, respective, narrowed, elongated portion. These elongated source and drain portions are oriented in parallel and in adjacent relation to each other, and a respective, complete longitudinal section of each elongated portion overlays a gate electrode. The resulting FET may be fabricated with readily-achievable photolithographic alignment precision as between the source and drain electrode configuration and the gate electrode, and achieves acceptably low source-to-gate and drain-to-gate parasitic capacitances.

14 Claims, 4 Drawing Figures

THIN FILM FIELD-EFFECT TRANSISTORS WITH TOLERANCE TO ELECTRODE MISALIGNMENT

BACKGROUND OF THE INVENTION

The present invention relates generally to thin film field-effect transistors and, more particularly, to such transistors that may be fabricated without stringent alignment between a source and drain electrode configuration and a gate electrode.

Thin film field-effect transistors (FETs) are semiconductor devices, which include, as basic elements, a single, thin (e.g., less than about 1 micron) semiconductor layer and various electrodes; namely, source and drain electrodes, and a gate electrode for controlling conduction between the source and drain electrodes. The source and drain electrodes each adjoin one major side of the semiconductor layer, while the gate electrode is insulatingly spaced from an opposite, major side of the semiconductor layer.

In the fabrication of the foregoing, thin film FETs, it is desired that both the source and drain electrodes overlap the gate electrode (as viewed from a direction orthogonal to the semiconductor layer), in order to ensure high transconductance between the source and drain electrodes. However, the source-to-gate and drain-to-gate overlaps are limited in extent to prevent the formation of large source-to-gate and drain-to-gate capacitances, which would create an undesired signal path between the source and drain electrodes. Accordingly, optimum FET performance has been achieved through stringent alignment of the source and drain electrodes (which are typically formed with a single mask) to the gate electrode, so that the source-to-gate and drain-to-gate overlaps fall within a fairly small range of, typically, 0.5 to 1.5 microns. In a practical manufacturing environment, however, such a stringent alignment requirement is not easily complied with. As a consequence, a typical manufacturing yield of a batch of thin film FETs tends to be lower than desirable, the yield being increasingly lower as the aggregate area occupied by the FETs increases.

SUMMARY OF THE INVENTION

Accordingly, it is an object of the present invention to provide thin film FETs with a high manufacturing yield.

A more particular object of the invention is to provide thin film FETs that may be fabricated without stringent alignment between a source and drain electrode configuration on one side of the FET and a gate electrode on an opposite side of the FET.

A further object of the invention is to provide misalignment-tolerant FETs with low values of source-to-gate and drain-to-gate capacitances.

The foregoing objects of the invention are realized in a preferred embodiment of the present invention comprising a misalignment-tolerant, thin film field-effect transistor (FET). The FET includes a layer of semiconductor material of, for example, amorphous silicon with a large area gate electrode layer dielectrically spaced from a first major side of the semiconductor layer. A source electrode layer adjoins a second major side of the semiconductor layer and includes at least one elongated source portion. A drain electrode also adjoins the second major side of the semiconductor layer and includes at least one elongated drain portion. The elongated source and drain portions are oriented in parallel and in adjacent relation to each other, with each elongated portion having a respective, complete longitudinal section overlapping, but being spaced from, the gate electrode layer.

BRIEF DESCRIPTION OF THE DRAWINGS

The features of the invention deemed to be novel are defined in the appended claims. The invention itself, however, both as to organization and operation, together with further objects and advantages thereof, may be best understood with reference to the following description when considered in conjunction with the accompanying drawings, in which:

DESCRIPTION OF THE PREFERRED EMBODIMENTS

Figure 1:
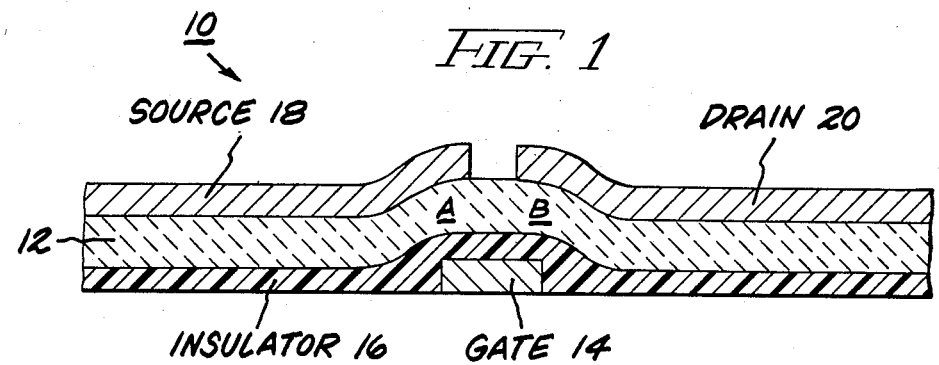
FIG. 1 is a schematic, cross-sectional view of a thin film field-effect transistor depicting the general arrangement of gate, source, and drain electrodes.

The general details of construction of a typical, thin film field-effect transistor (FET) 10 are illustrated in FIG. 1. Device 10 includes a central layer 12 of semiconductor material, such as amorphous silicon or amorphous cadmium selenide. Layer 12 may or may not be homogeneous in composition, and preferably has a thickness less than about 1 micron. A gate electrode layer 14, of aluminum, molybdenum or other suitable conducting material, is dielectrically spaced, by insulator 16, from the lower-illustrated, major side of semiconductor layer 12. Insulator layer 16 typically comprises a 0.01 to 1 micron thick layer of silicon nitride or silicon dioxide, by way of example.

A source electrode layer 18, of aluminum, molybdenum or other suitable conductive layer, adjoins the upper-illustrated, major side of semiconductor layer 12. A drain electrode layer 20 of aluminum, molybdenum or other suitable conducting layer, also adjoins the upper-illustrated, major side of semiconductor layer 12 and is spaced from source electrode 18.

The operation of a typical thin film FET, such as FET 10, is well known in the art. Generally, in FET 10, device operation involves a creation and elimination of a conducting channel (not illustrated) in the lower-illustrated portion of semiconductor layer 12, between point A (beneath source electrode 18) and point B (beneath drain electrode 20). This is achieved through bias control of gate electrode 14 in a manner known in the art.

Figure 2:
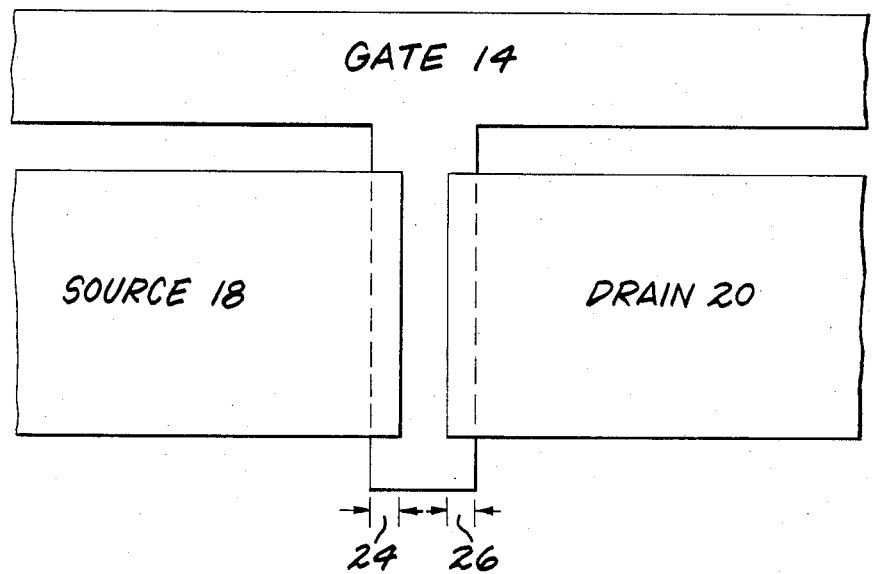
FIG. 2 is a simplified, top plan view of the field-effect transistor of FIG. 1 illustrating only gate, source, and drain electrodes, in accordance with the prior art.

In order to more clearly point out the features of the present invention, a typical, prior art electrode arrangement as shown in FIG. 2 is first considered. FIG. 2 depicts only gate 14, source 18, and drain 20 electrodes of the FIG. 1 device for simplicity.

In regard to FIG. 2, source and drain electrodes 18 and 20, respectively, are formed by a single mask (not shown). These electrodes 18 and 20 are aligned with gate electrode 14. The fabrication step for rendering such alignment may be described as a stringent alignment step, since optimum FET operation requires source-to-gate overlap 24 and drain-to-gate overlap 26 each to be within a range of about 0.5–1.5 micron. This is due to overlaps 24 and 26 both having a lower limit of about 0.5 microns, to assure high device transconductance, and a upper limit of about 1.5 microns, to limit source-to-gate and drain-to-gate capacitances. For a one-micron design overlap, the margin of error is only ±0.5 microns. This margin may be exceeded by either lateral or rotational displacement (as viewed in FIG. 2) of the mask (not shown) for source 18 and drain 20 electrodes and a substrate (not shown) upon which FET 10 is fabricated. Such displacement may be due to such hard-to-control causes as warping of the substrate on which FET 10 is fabricated or differential thermal expansion between such substrate and the mask (not shown) for source 18 and drain 20 electrodes.

Figure 3:
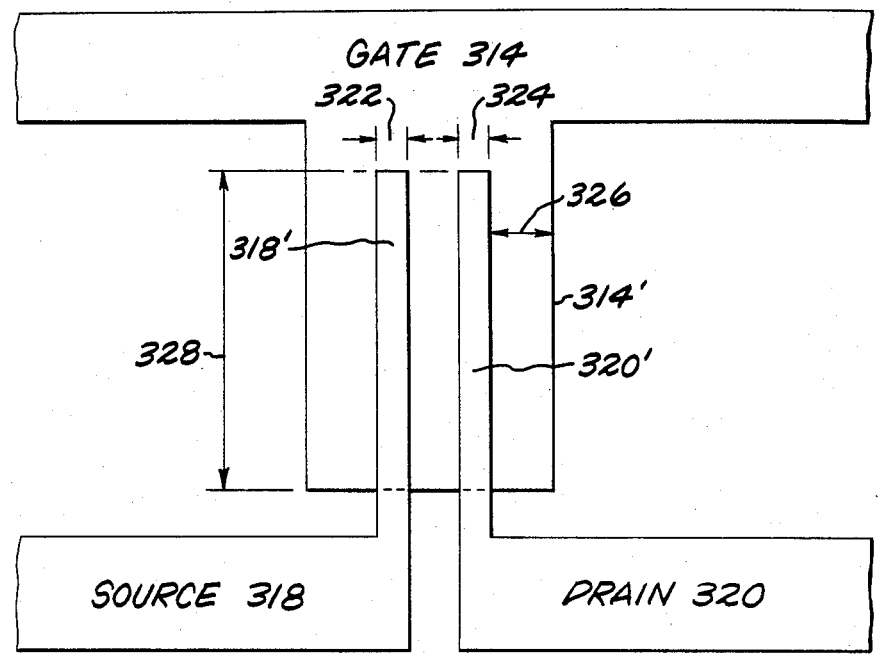
FIG. 3 is a view similar to FIG. 2 illustrating gate, source, and drain electrodes in accordance with the present invention.

Both (1) a considerable relaxation in stringency of alignment of source and drain electrodes to a gate electrode and (2) minimization of source-to-gate and drain-to-gate capacitances is achieved with the electrode structure shown in FIG. 3.

In FIG. 3, source electrode 318 includes an elongated source portion 318', and drain electrode 320 similarly includes an elongated drain portion 320'. Elongated source 318' and drain 320' portions are oriented in parallel and in adjacent relation to each other. A complete longitudinal section of source portion 318' overlies gate electrode 314; that is, the entire width 322 of a longitudinal section of source portion 318' overlies gate electrode 314. Similarly, a complete longitudinal section of elongated drain portion 320' overlies gate electrode 314.

Due to the configurations and arrangement of gate 314, source 318, and drain 320 electrodes, a misalignment-tolerant FET is provided. Specifically, the tolerance for aligning the source-drain mask (not shown) to gate electrode 314 is ±3 microns where the FIG. 3 electrodes have the following dimensions: widths 322 and 324 of source 318' and drain 320' portions, respectively, each being in a preferred range of about 0.5 to 5 microns; and dimension 326, between elongated drain portion 320' and the right-hand illustrated edge 314' of gate electrode 314, being in a preferred range from about 3 to 5 microns. The alignment tolerance for the FIG. 3 electrode arrangement is thus six times greater than for the prior art electrode arrangement of FIG. 2 (i.e., ±3 microns vs. ±0.5 microns), and this results in a misalignment-tolerant FET. Widths 322 and 324 may be other than in the 0.5 to 5 micron range as in the foregoing example, preferably being in the larger range of about 0.5 to 20 microns.

The FIG. 3 electrode arrangement also provides low source-to-gate and drain-to-gate capacitance values. For example, with widths 322 and 324 of source 318' and drain 320' portions each being 3 microns and an overlap 328 (between source 318 and gate 314 electrodes and also between drain 320 and gate 314 electrodes) being 40 microns, the source-to-gate and drain-to-gate capacitance values are typically less than $10^{-13}$ Farads for a FET having a transconductance value of $10^{-8}$ mhos per square of channel area. Accordingly, unwanted signal coupling between source 318 and drain 328 electrodes is reduced to an acceptable level. Overlap 328 may be other than 40 microns as in the foregoing example, preferably being in the range of 1 to 10,000 microns.

Figure 4:
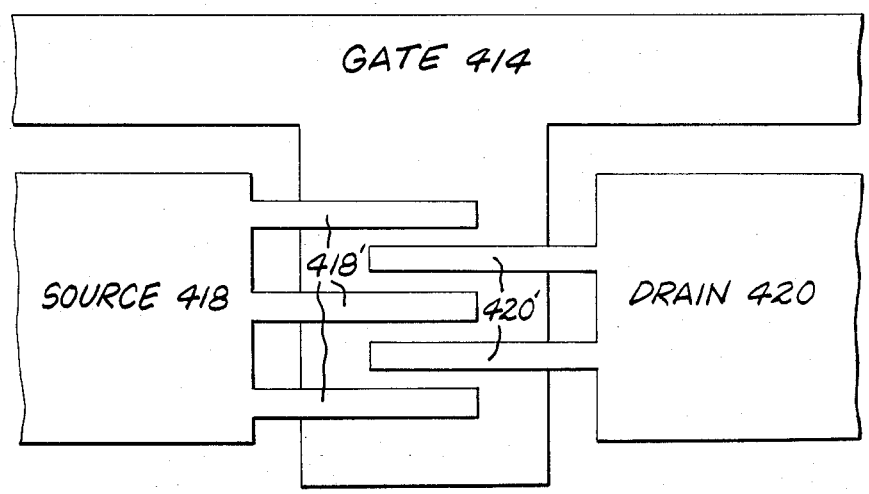
FIG. 4 is a view similar to FIG. 2 illustrating gate, source, and drain electrodes, in accordance with a further embodiment of the present invention.

FIG. 4 illustrates an alternative to the source 318 and drain 320 electrode arrangement of FIG. 3. As shown in FIG. 4, source electrode 418 includes, preferably three, elongated source portions 418', while drain electrode 420 includes, preferably two, elongated drain portions 420'. Elongated source portions 418' are oriented in parallel with and in interdigitated relation with elongated drain portions 420'.

The FIG. 4 electrode arrangement results in a misalignment-tolerant FET having acceptably low source-to-gate and drain-to-gate capacitance values, and high transconductance in a small device area.

Formation of gate, source, and drain electrodes according to the present invention can be carried out using conventional photolithographic techniques.

The foregoing describes misalignment-tolerant field-effect transistors that benefit from having acceptably low values of source-to-gate and drain-to-gate capacitances.

While only certain preferred features of the invention have been shown by way of illustration, many modifications and changes will occur to those skilled in the art. For example, device performance and size considerations may require that the number and dimensions of elongated source and drain portions vary from that which is specifically described herein. It is, therefore, to be understood that the appended claims are intended to cover all such modifications and changes as fall within the true spirit and scope of the invention.

What is claimed as the invention and desired to be secured by Letters Patent of the United States is:

1. A misalignment-tolerant field-effect transistor, comprising:
   a layer of semiconductor material;
   a gate electrode layer insulatingly spaced from a first major side of said semiconductor layer;
   a source electrode layer adjoining a second major side of said semiconductor layer and including at least one elongated source portion; and
   a drain electrode layer adjoining said second major side of said semiconductor layer, being spaced from said source electrode layer, and including at least one elongated drain poriton;
   said elongated source and drain portions being parallel and in adjacent relation to each other and each having the entire width of its longitudinal section overlapping said gate electrode layer.

2. The field-effect transistor of claim 1 wherein said elongated source and drain electrode portions each have an electrode width in the range from about 0.5 to 20 microns.

3. The field-effect transistor of claim 2 wherein said semiconductor layer comprises amorphous silicon.

4. The field-effect transistor of claim 3 wherein said amorphous silicon semiconductor layer is below about 1 micron in thickness.

5. The field-effect transistor of claim 3 wherein said source electrode comprises a single elongated sopurce portion and said drain electrode comprises a single elongated drain portion.

6. The field-effect transistor of claim 5 wherein said single, elongated source portion and said single, elongated drain portion are each between about 0.5 and about 20 microns in width.

7. The field-effect transistor of claim 6 wherein each of said source and drain electrodes overlaps said gate electrode by more than about 1 micron in a longitudinal direction.

8. The field-effect transistor of claim 1 wherein said source electrode layer comprises a plurality of elongated source portions and said drain electrode layer comprises a plurality of elongated drain portions, said elongated source portions being arranged in interdigitated fashion with said elongated drain portions.

9. The field-effect transistor of claim 1 wherein said semiconductor layer comprises amorphous silicon with a thickness below about 1 micron.

10. The field-effect transistor of claim 1 wherein said semiconductor layer is below about 1 micron in thickness.

11. A misalignment-tolerant field-effect transistor, comprising:
- a layer of semiconductor material;
- a source electrode layer adjoining a first major side of said semiconductor layer and including a body portion and at least one elongated source portion;
- a drain electrode layer adjoining said first major side of said semiconductor layer, being spaced from said source electrode layer, and including a body portion and at least one elongated drain portion; said elongated source and drain portions being substantially parallel and in adjacent relation to each other; and
- a gate electrode layer insulatingly spaced from a second major side of said semiconductor layer overlapping the width of said elongated drain portion and said elongated source portion.

12. The field-effect transistor of claim 11 wherein said dimension of said gate electrode perpendicular to the direction of elongation of said source and drain electrodes being greater than the combined widths of said source and drain electrode plus twice a tolerance factor.

13. The field-effect transistor of claim 12 wherein the tolerance factor is in the range of 3–5 microns.

14. The field-effect transistor of claim 11 wherein said source electrode layer comprises a plurality of elongated source portions and said drain electrode layer comprises a plurality of elongated drain portions, said elongated source portions being arranged in interdigitated fashion with said elongated drain portions.

* * * * *

Disclaimer 4,597,001.—*Jacob C. Bortscheller*, Ballaston Spa; *Jack D. Kingsley*, Schenectady; *William W. Piper*, Scotia, all of N. Y. THIN FILM FIELD-EFFECT TRANSISTORS WITH TOLERANCE TO ELECTRODE MISALIGNMENT. Patent dated June 24, 1986. Disclaimer filed Oct. 23, 1989, by the assignee, General Electric Company.

Hereby enters this disclaimer to all claims of said patent.
*[ Official Gazette January 2, 1990]*